(12) United States Patent
Glodde et al.

(10) Patent No.: US 9,425,053 B2
(45) Date of Patent: Aug. 23, 2016

(54) BLOCK MASK LITHO ON HIGH ASPECT RATIO TOPOGRAPHY WITH MINIMAL SEMICONDUCTOR MATERIAL DAMAGE

(71) Applicant: International Business Machines Corporation, Armonk, NY (US)

(72) Inventors: Martin Glodde, Mahwah, NJ (US); Steven J. Holmes, Albany, NY (US); Daiji Kawamura, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 130 days.

(21) Appl. No.: 14/317,003

(22) Filed: Jun. 27, 2014

(65) Prior Publication Data
US 2015/0380251 A1   Dec. 31, 2015

(51) Int. Cl.
| | |
|---|---|
| *H01L 21/28* | (2006.01) |
| *H01L 21/3213* | (2006.01) |
| *H01L 29/66* | (2006.01) |

(52) U.S. Cl.
CPC .... *H01L 21/28123* (2013.01); *H01L 21/28088* (2013.01); *H01L 21/32139* (2013.01); *H01L 29/66545* (2013.01)

(58) Field of Classification Search
CPC .................. H01L 21/0331; H01L 21/0337
See application file for complete search history.

(56) References Cited

U.S. PATENT DOCUMENTS

| | | | |
|---|---|---|---|
| 6,399,446 B1 | 6/2002 | Rangarajan et al. | |
| 8,293,625 B2 | 10/2012 | Kwon | |
| 8,426,319 B2 | 4/2013 | Mistkawi et al. | |
| 2010/0190347 A1 | 7/2010 | RamachandraRao et al. | |
| 2011/0306207 A1 | 12/2011 | Raghavan et al. | |
| 2013/0005147 A1* | 1/2013 | Angyal ............ H01L 21/31116 438/692 |
| 2013/0049015 A1 | 2/2013 | Fang et al. | |
| 2013/0056441 A1 | 3/2013 | Kimura et al. | |
| 2015/0171177 A1* | 6/2015 | Cheng ............... H01L 29/42372 257/288 |

FOREIGN PATENT DOCUMENTS

| | | |
|---|---|---|
| CN | 10300534 A | 3/2013 |
| JP | 2010205971 A | 9/2010 |
| JP | 4968477 B2 | 4/2012 |

* cited by examiner

*Primary Examiner* — Bac Au
(74) *Attorney, Agent, or Firm* — Scully, Scott, Murphy & Presser, P.C.; Steven J. Meyers

(57) ABSTRACT

A trilayer stack that can be used as a block mask for forming patterning features in semiconductor structures with high aspect ratio topography is provided. The trilayer stack includes an organic planarization (OPL) layer, a titanium-containing antireflective coating (TiARC) layer on the OPL layer and a photoresist layer on the TiARC layer. Employing a combination of an OPL having a high etch rate and a TiARC layer that can be easily removed by a mild chemical etchant solution in the trilayer stack can significantly minimize substrate damage during lithographic patterning processes.

19 Claims, 9 Drawing Sheets

BLOCK MASK LITHO ON HIGH ASPECT RATIO TOPOGRAPHY WITH MINIMAL SEMICONDUCTOR MATERIAL DAMAGE

BACKGROUND

The present disclosure relates to semiconductor device fabrication. More particularly, the present disclosure relates to using a trilayer stack including a photoresist layer, a wet-strippable titanium-containing antireflective coating (TiARC) layer and an organic planarization layer (OPL) as a block mask to minimize substrate damage during lithographic patterning.

A Fin field effect transistor (FinFET) is a promising device structure for scaled complementary metal-oxide-semiconductor (CMOS) logic and memory applications in 22 nm technology and beyond due to its good short channel effect (SCE) controllability and its small variability. The manufacture of FinFETs with high aspect ratio topography in CMOS devices can be challenging because conventional block masks used to form various patterning features are very difficult to completely remove and a reactive ion etch (RIE) that is performed to remove any residue of the block masks often results in surface damage to the substrate. Such damage can have a negative impact on the characteristics of FinFETs. Therefore, there remains a need to develop a block mask scheme that can be easily removed by wet chemical etching to avoid damages to the substrate as well as the components of the FinFETs.

SUMMARY

The present disclosure provides a trilayer stack that can be used as a block mask for forming patterning features in semiconductor structures with high aspect ratio topography. The trilayer stack includes an organic planarization (OPL) layer, a titanium-containing antireflective coating (TiARC) layer on the OPL layer and a photoresist layer on the TiARC layer. Employing a combination of an OPL having a high etch rate and a TiARC layer that can be easily removed by a mild chemical etchant solution in the trilayer stack can significantly minimize substrate damage during lithographic patterning processes.

In one aspect of the present disclosure, a method of forming a semiconductor structure is provided. The method includes first forming a trilayer stack on an initial semiconductor structure formed on a substrate. The trilayer stack includes an OPL, a TiARC layer on the OPL and a photoresist layer on the TiARC layer. A pattern in the trilayer stack is then formed by etching through the trilayer stack to expose a portion of the initial semiconductor structure. Next, a remaining portion of the trilayer stack is removed. The removal of the remaining portion of the trilayer stack causes no damage to a component of the semiconductor structure and the substrate, and after the removal of the remaining portion of the trilayer stack, substantially no residue from the trilayer stack remains in the semiconductor structure.

DETAILED DESCRIPTION

Figure 1:
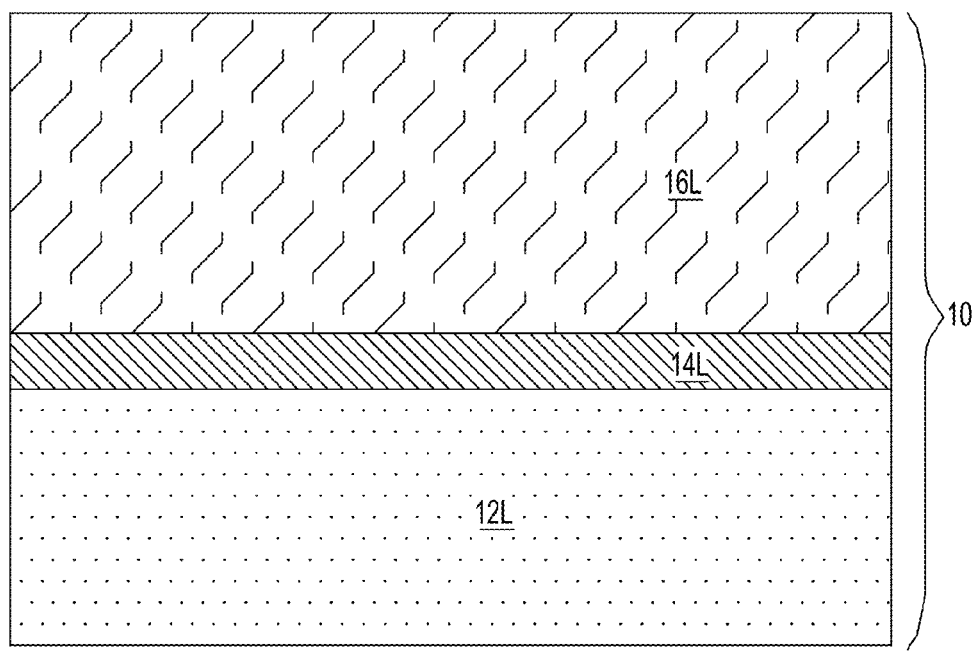
FIG. 1 is a cross-sectional view of a trilayer stack of the present disclosure that can be used as a block mask for lithographic patterning.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Referring to FIG. 1, there is illustrated a trilayer stack 10 of the present disclosure that can be used as a block mask for lithographic patterning. It is noted that the trilayer stack 10 illustrated FIG. 1 is after deposition of the various layers in the stack 10 upon a device structure formed on a substrate, but prior to patterning any of the layers within the trilayer stack 10. Specifically, the trilayer stack 10 includes, from bottom to top, an organic planarization layer (OPL) 12L, a titanium-containing antireflective coating (TiARC) layer 14L, and a photoresist layer 16L.

The OPL 12L can comprise any organic material that allows a fast RIE process to reduce RIE damage to a semiconductor substrate, such as, for example, a silicon substrate. Examples of organic materials that can be employed as the OPL 12L include, but are not limited to, spin-on carbon (SOC), diamond-like carbon, polyarylene ether, and polyimide. In one embodiment, the OPL 12 includes an organic material that can be etched away at least twice faster than materials of OPLs commonly used in the art having etching rate ranging from 100 nm/min to 150 nm/min in a typical $N_2/H_2$ OPL etch process. In one embodiment, the OPL 12 that can be employed in the present disclosure has an etch rate ranging from 300 nm/min to 400 nm/min in a $N_2/H_2$ gas mixture.

The OPL 12L can be formed utilizing any conventional deposition process including, for example, chemical vapor deposition (CVD), plasma enhanced chemical vapor deposition (PECVD), evaporation, spin coating and dip coating. Chemical mechanical planarization (CMP) and/or grinding can be used to planarize the deposited OPL 12L. The thickness of the OPL 12L may vary depending on the material as well as the deposition technique used in forming the OPL 12L. The OPL 12L can have a thickness from 50 nm to 500 nm, with a thickness from 150 nm to 300 nm being more typical. In one embodiment of the present disclosure, the OPL 12L has a thickness about 200 nm.

The TiARC layer 14L can include any Ti-containing material that is soluble in a mild chemical etchant, such as, for example, a SC1 solution (a mixture of deionized water, ammonium hydroxide and hydrogen peroxide) that is employed in a subsequent wet chemical clean process. In one embodiment, the TiARC layer 14L includes a Ti-containing organic inorganic hybrid polymer having a Ti-containing backbone with organic side chain functional groups. Exemplary organic side chain functional groups include, but are not limited to, liner or branched alkyl groups, liner or branched alkoxy groups and substituted or unsubstituted aryl groups. In another embodiment, the TiARC layer 14L includes Ti or TiN. These Ti-containing materials also possess a high etch resistance to the RIE process for etching the OPL 12L.

The TiARC layer 14L can be formed by spin coating, spray coating, dip coating, PECVD or sputtering. The TiARC layer 14L that is formed can have a thickness from 5 nm to 100 nm, with a thickness from 10 nm to 20 nm being more typical. In one embodiment of the present disclosure, the TiARC layer 14L has a thickness about 15 nm.

The photoresist layer 16L that can be employed in the present disclosure includes any conventional organic photoresist material, such as, for example, methacrylates and polyesters.

The photoresist layer 16L can be formed utilizing any conventional deposition process including, but are not limited to, CVD, PECVD, evaporation, spin coating and dip coating. The photoresist layer 16L can have a thickness from 30 nm to 500 nm, with a thickness from 100 nm to 200 nm being more typical.

The trilayer stack 10 of the present disclosure can be used as a block mask to define patterning features in semiconductor devices. Employing a combination of an OPL 12L having a high etch rate which requires a less RIE etch time and a TiARC layer 14L that can be removed in a mild chemical etchant solution in the block mask of the present disclosure can significantly minimize damages to the substrate or any device structure covered thereby during lithographic patterning processes. In addition, the high etch resistance of the TiARC layer 14L to the RIE of the OPL 12L prevents the erosion of the block mask during the RIE process, thus providing a better edge placement for lithographic lines. The high etch resistance of the TiARC layer 14L also allows using a thin TiARC layer 14L (e.g., 15 nm) in the trilayer stack 10 to reduce an overall thickness of the trilayer stack 10. As a result, a better focus and exposure process window can be achieved for the lithographic patterning processes.

FIGS. 2-6 illustrate one embodiment of the present disclosure in which the trilayer stack 10 is employed to optimize work function in FinFETs of a CMOS device. However, the present disclosure is generally applicable to any semiconductor device fabrication process in which a block mask is used to define patterning features.

Figure 2:
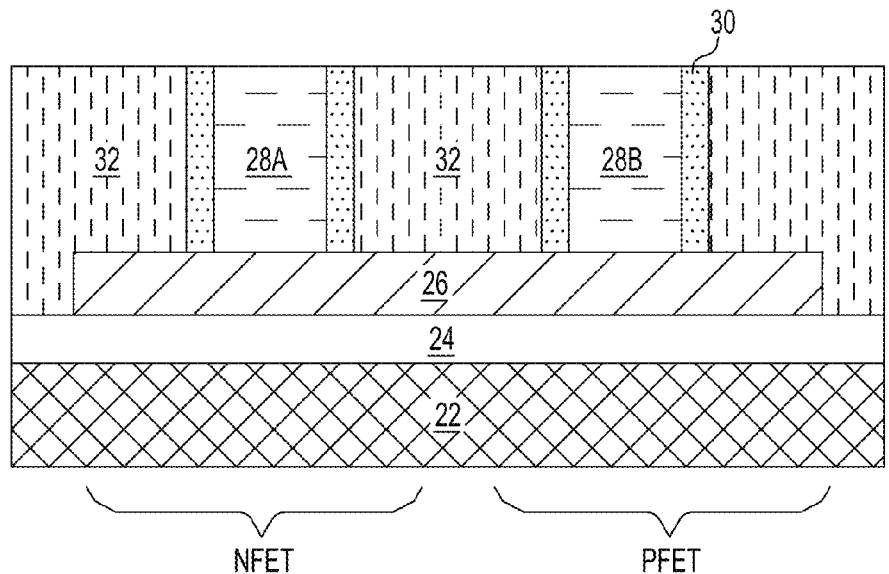
FIG. 2 is a cross-sectional view of an exemplary semiconductor structure after forming sacrificial gate structures over a portion of each semiconductor fin and interlevel dielectric (ILD) layer portions over the semiconductor fins, gate spacers and a substrate according to one embodiment of the present disclosure.

Referring to FIG. 2, there is illustrated an initial semiconductor structure that can be employed in one embodiment of the present disclosure. The semiconductor structure includes a pair of sacrificial gate structures 28A, 28B formed over a portion of each semiconductor fin 26, gate spacers 30 formed on each side of the sacrificial gate structures 28A, 28B and ILD layer portions 32 that are formed over the semiconductor fins 26 and a substrate on which the semiconductor fins 26 are present. The ILD layer portions 32 laterally bound sacrificially gate structures 28. Although only a pair of sacrificial gate structure 28A, 28B are described and illustrated, the present disclosure is not limited to such a number of sacrificial gate structures. Instead, a plurality of sacrificial gate structures can be formed over the semiconductor fins 26.

The semiconductor fins 26 can be formed by patterning a top semiconductor layer (not shown) of a semiconductor-on-insulator (SOI) substrate. In another embodiment, the semiconductor fins 26 can be formed by patterning an upper portion of a bulk semiconductor substrate (not shown).

The SOI substrate includes, from bottom to top, a handle substrate 22, a buried insulator layer 24 and a top semiconductor layer (not shown) from which the semiconductor fins 26 are formed.

In some embodiments, the handle substrate 22 and the top semiconductor layer may comprise the same, or different, semiconductor material. The term "semiconductor" as used herein in connection with the semiconductor material of the handle substrate 22 and the top semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 22 and the top semiconductor layer. In one embodiment, the handle substrate 22 and the top semiconductor layer are both comprised of Si. In another embodiment, hybrid SOI substrates are employed which have different surface regions of different crystallographic orientations.

The handle substrate 22 and the top semiconductor layer may have the same or different crystal orientation. For example, the crystal orientation of the handle substrate 22 and/or the top semiconductor layer may be {100}, {110}, or {111}. Other crystallographic orientations besides those specifically mentioned can also be used in the present disclosure. The handle substrate 22 and/or the top semiconductor layer of the SOI substrate may be a single crystalline semiconductor material, a polycrystalline material, or an amorphous material. Typically, at least the top semiconductor layer and thus fins 26 is a single crystalline semiconductor material.

In some embodiments, the handle substrate 22 is a non-semiconductor material including, for example, a dielectric material and/or a conductive material. In other embodiments of the present disclosure, the handle substrate 22 is optional and the initial semiconductor structure that is employed includes only the buried insulator layer 24 and the top semiconductor layer.

The buried insulator layer 24 of the SOI substrate may be a crystalline or non-crystalline oxide or nitride. In one embodiment, the buried insulator layer 24 is an oxide. The buried insulator layer 24 may be continuous, as shown, or it may be discontinuous. When a discontinuous buried insulating region is present, the insulating region exists as an isolated island that is surrounded by semiconductor material.

The thickness of the top semiconductor layer of the SOI substrate can be from 10 nm to 100 nm, with a thickness from 20 nm to 70 nm being more typical. If the thickness of the top semiconductor layer is not within the above mentioned range, a thinning step such as, for example, planarization or etching can be used to reduce the thickness of the top semiconductor layer to a value within the range mentioned above.

The thickness of the buried insulator layer 24 of the SOI substrate can be from 1 nm to 200 nm, with a thickness from 100 nm to 150 nm being more typical.

The thickness of the handle substrate 22 of the SOI substrate can be from 400 µm to 1,000 µm, with a thickness from 50 µm to 900 µm being more typical.

In some embodiments of the present disclosure, a hard mask layer (not shown) can be formed on the top semiconductor layer prior to forming the semiconductor fin 26. During the subsequent formation of the semiconductor fins 26, a portion of the hard mask layer provides a fin cap on a top surface of each semiconductor fin 26. In such a structure, the sacrificial gate structure 28A, 28B to be subsequently formed is present only along the vertical sidewalls of each semiconductor fin 26. In the embodiment that is illustrated, no fin cap is present, and, as such, the sacrificial gate structure 28A, 28B is present along the vertical sidewalls and on a top surface of each semiconductor fin 26.

When employed, the hard mask layer may comprise an oxide, nitride, oxynitride or any combination thereof including multilayers. In one embodiment, the hard mask layer includes silicon oxide or silicon nitride. The hard mask layer can be formed utilizing a conventional deposition process such as, for example, CVD, PECVD, chemical solution deposition, evaporation or other like deposition processes. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, with a thickness from 30 nm to 60 nm being more typical.

The semiconductor fins 26 can be formed by lithography and etching of the top semiconductor layer of the SOI substrate. The lithographic step includes applying a photoresist layer (not shown) atop the top semiconductor layer, exposing the photoresist layer to a desired pattern of radiation, and developing the exposed photoresist layer utilizing a conventional resist developer. The etching process comprises dry etching and/or wet chemical etching. Suitable dry etching processes that can be used in the present disclosure include, but are not limited to, reactive ion etching, ion beam etching, plasma etching or laser ablation. Typically, a RIE process or an ion beam etching process is used. The etching process transfers the pattern from the patterned photoresist layer to the top semiconductor layer or first to the hard mask layer if present and thereafter to the underlying top semiconductor layer utilizing the buried insulator layer 24 as an etch stop. After transferring the pattern into the top semiconductor layer, the patterned photoresist layer can be removed utilizing a conventional resist stripping process such as, for example, ashing. Alternatively, the semiconductor fins 26 can also be formed utilizing a sidewall image transfer (SIT) process. In a typical SIT process, a spacer is formed on a dummy mandrel. The dummy mandrel is removed and the remaining spacers are used as a hard mask to etch the semiconductor fins 26. The spacers are then removed after the semiconductor fins 26 have been formed.

Each of the semiconductor fins 26 formed may have a height ranging from 5 nm to 200 nm, with a height ranging from 10 nm to 100 nm being more typical, and a width ranging from 4 nm to 50 nm, with a width ranging from 5 nm to 20 nm being more typical. Adjacent semiconductor fins 26 may be separated by a pitch ranging from 20 nm to 100 nm, with a pitch ranging from 30 nm to 50 nm being more typical.

In some embodiments of the present disclosure and when the hard mask layer is present, the hard mask layer that remains atop the semiconductor fins 26 can be removed at this stage. The removal of the remaining non-etched portion of hard mask layer can be achieved by performing a selective etching process or by utilizing a planarization process such as chemical mechanical planarization.

The sacrificial gate structures 28A, 28B can be formed by first providing a blanket layer of a sacrificial gate material (not shown) over the semiconductor fins 26 and the buried insulator layer 24. The blanket layer of sacrificial gate material can be formed, for example, by CVD or PECVD. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present disclosure, the blanket layer of sacrificial gate material may be composed of a metal such as, for example, Al, W, or Cu. After providing the blanket layer of sacrificial gate material, the blanket layer of sacrificial gate material can be patterned by lithography and etching with the buried insulator layer 24 serving as an etch stop so as to form sacrificial gate structures 28A, 28B that are oriented perpendicular to and straddle a portion of each semiconductor fin 26.

The gate spacer 30 can be formed by first depositing a conformal spacer material layer (not shown) over the sacrificial gate structures 28A, 28B and the semiconductor fins 26, for example, by CVD or ALD. The conformal spacer material layer includes a dielectric material, such as, for example silicon nitride, or silicon oxynitride. The thickness of the conformal spacer material layer can be from 3 nm to 20 nm, although lesser and greater thicknesses can also be employed. Horizontal portions of the conformal spacer material layer are subsequently removed by an anisotropic etch, such as, for example, a RIE process. In one embodiment of the present disclosure, the RIE process is continued to remove vertical portions of the conformal spacer material layer that are formed on the sidewalls of the semiconductor fins 26. The remaining vertical portions of the conformal spacer material layer abutting sidewalls of the sacrificial gate structures constitute the gate spacers 30.

At this stage of the present disclosure, a source region and a drain region (collectively referred to as source/drain regions, not shown) may now be formed on portions of the semiconductor fins 26 on each side of the sacrificial gate structures 28A, 28B with any suitable techniques know in the art, including, use of spacer, ion implantation, source/drain recess, epitaxial growth of source/drain materials, activation anneals and/or silicide formation. In some embodiments, the source/drain regions can be formed using top-down deep implants with dopants. In the drawings and by way of illustration, n-type FinFET devices in an n-type FET (NFET) region may be produced by implanting n-type dopants into portions of the semiconductor fins 26 on opposite sides of the sacrificial gate structure 28A, while p-type FinFET devices may be produced in a p-type FET (PFET) region by implanting p-type dopants into portions of the semiconductor fins 26 on opposite sides of the sacrificial gate structure 28B. Examples of n-type dopants include, but are not limited to antimony, arsenic and phosphorus. Examples of p-type dopants include, but are not limited to, aluminum, gallium and indium. The dopants in the source/drain regions can be active with a high-temperature rapid thermal anneal with the sacrificial gate structures 28A, 28B in place.

The ILD layer portions 32 can be formed by first providing a ILD layer (not shown) over the substrate, covering the sacrificial gate structures 28A, 28B and the gate spacers 30 and filling spaces between the sacrificial gate structures 28A, 28B. The ILD layer is generally composed of a dielectric material that may be easily planarized. For example, the ILD layer can be composed of a doped silicate glass, an undoped silicate glass (silicon oxide), an organosilicate glass (OSG), or a porous dielectric material. The ILD layer can be subsequently planarized, for example, by chemical mechanical planarization (CMP) and/or a recess etch using the sacrificial gate structures 28A, 28B as an etch stop to expose top surfaces of the sacrificial gate structures 28A, 28B.

Figure 3:
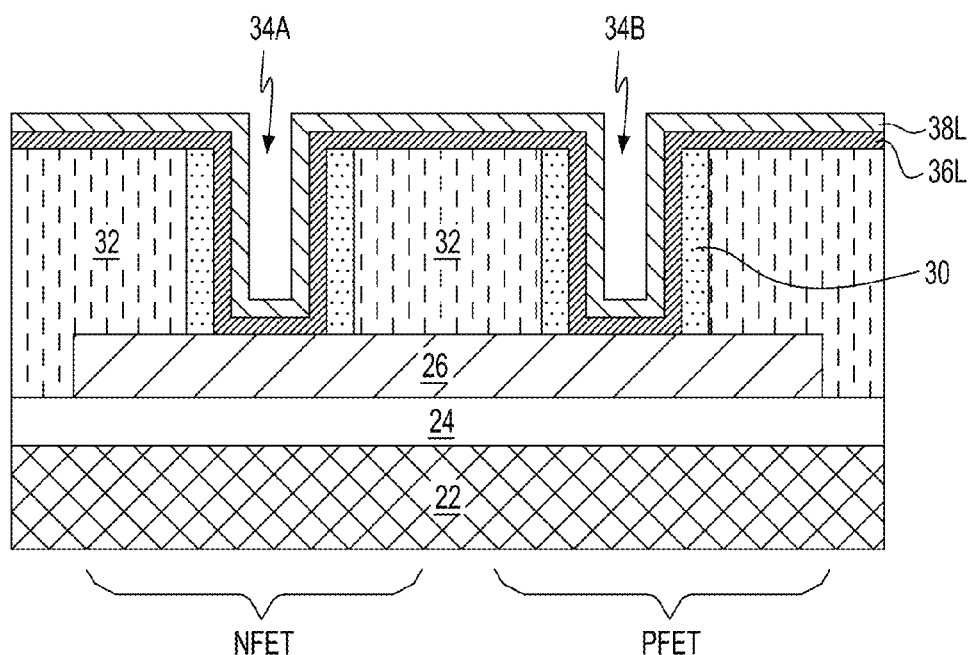
FIG. 3 is a cross-sectional view of the exemplary semiconductor structure of FIG. 2 after removing the sacrificial gate structures to provide gate cavities and forming a gate dielectric layer and an overlying work function metal layer over surfaces of the gate cavities and top surfaces of the ILD layer portions.

Referring to FIG. 3, there is illustrated the exemplary semiconductor structure of FIG. 2 after removing the sacrificial gate structures 28A, 28B to provide gate cavities 34A, 34B and forming a gate dielectric layer 36L and an overlying work function metal layer 38L over surfaces of gate cavities 34A, 34B and top surfaces of the ILD layer portions 32.

The sacrificial gate structures 28A, 28B can be removed selective to the semiconductor fins 26, the gate spacers 30 and the ILD layer portions 32 using a wet chemical etch or a dry etch. In one embodiment and when the sacrificial gate structures 28A, 28B are composed of polysilicon, the sacrificial gate structures 28A, 28B can be removed using a silicon-specific RIE process. A gate cavity 34A is thus formed within a volume from which the sacrificial gate structure 28A is removed and a gate cavity 34B is thus formed within a volume from which the sacrificial gate structure 28B is removed. The gate cavities 34A and 34B are laterally confined by inner sidewalls of the gate spacers 30.

The gate dielectric layer 36L can be formed by conformally depositing a dielectric material by CVD or ALD over surfaces of the gate cavities 34A, 34B and top surfaces of the ILD layer portions 32. In one embodiment, the gate dielectric layer 36L is composed of a high-k material having a dielectric constant greater than silicon oxide. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric layer 36L can have a thickness from 0.9 nm to 10 nm, with a thickness ranging from 1.0 nm to 3 nm being more typical.

The work function metal layer 38L can be conformally formed over the gate dielectric layer 36 by using CVD, sputtering, or plating. The work function metal layer 38L can include TiN, TaN, WN, TiC, TaC or WC. In one embodiment, the work function metal layer 38L is composed of TiN, a nitride commonly used as a p-type work functional metal in a p-type metal gate structure. The work function metal layer 38L can have a thickness ranging from 1 nm to 10 nm, with a thickness ranging from 2 nm to 5 nm being more typical.

Figure 4:
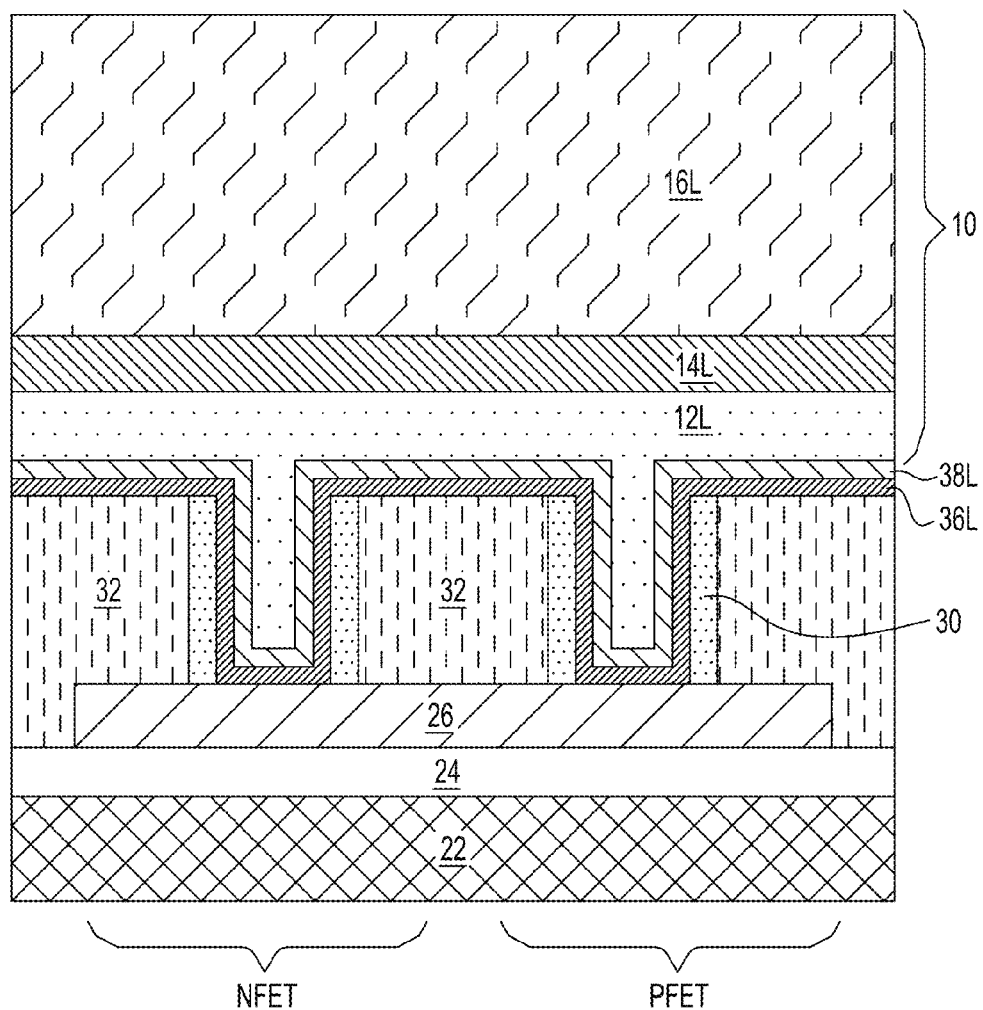
FIG. 4 is a cross-sectional view of the exemplary semiconductor structure of FIG. 3 after applying the trilayer stack of FIG. 1 over the entire semiconductor structure.

Referring to FIG. 4, there is illustrated the exemplary semiconductor structure of FIG. 3 after applying the trilayer stack 10 of FIG. 1 over the entire semiconductor structure of FIG. 3. The trilayer stack 10 can be formed using the processing steps described above with respect to FIG. 1. The OPL 12L fills the remaining volume of the gate cavities 34A, 34B.

Figure 5A:
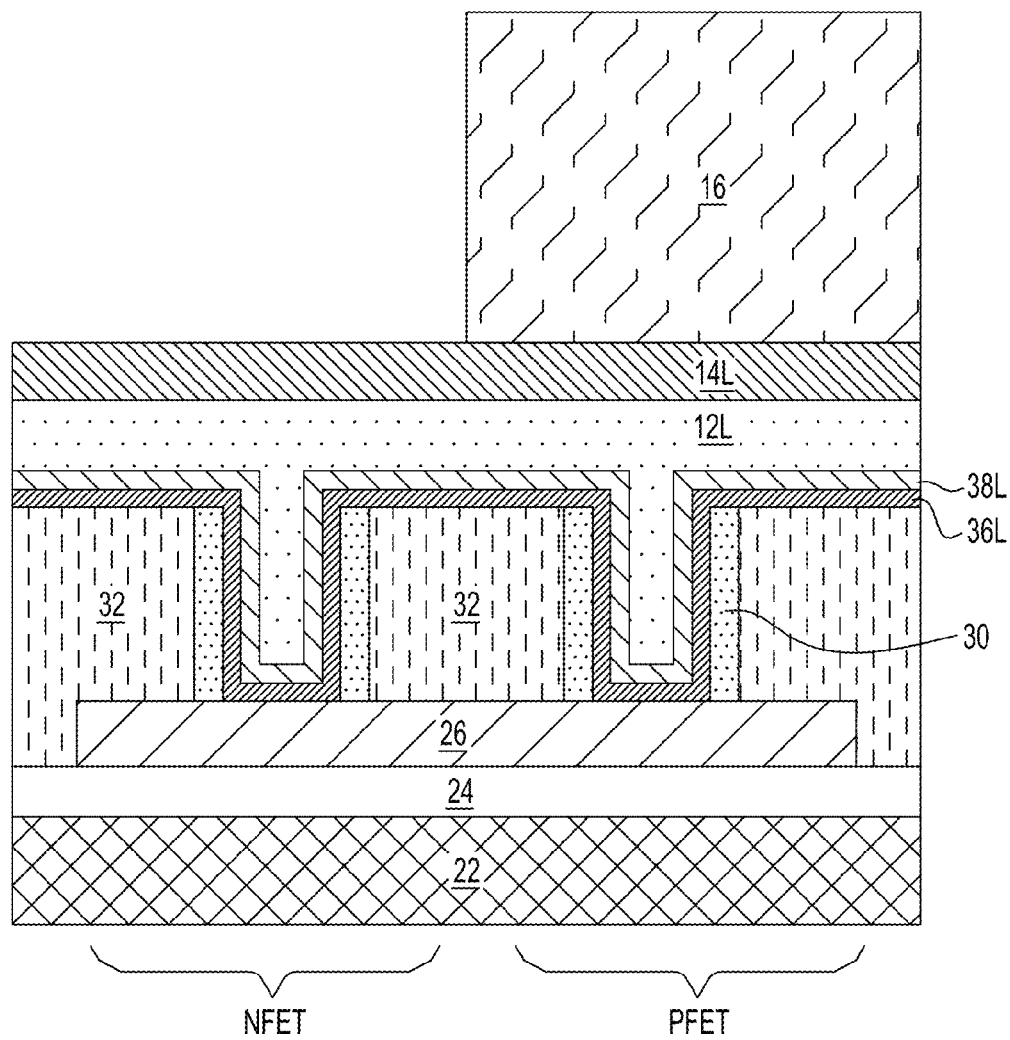
FIGS. 5A-5C are cross-sectional view of the exemplary semiconductor structure of FIG. 4 after patterning the trilayer stack to expose a portion of the work function metal layer in an NFET region.
Figure 5B:
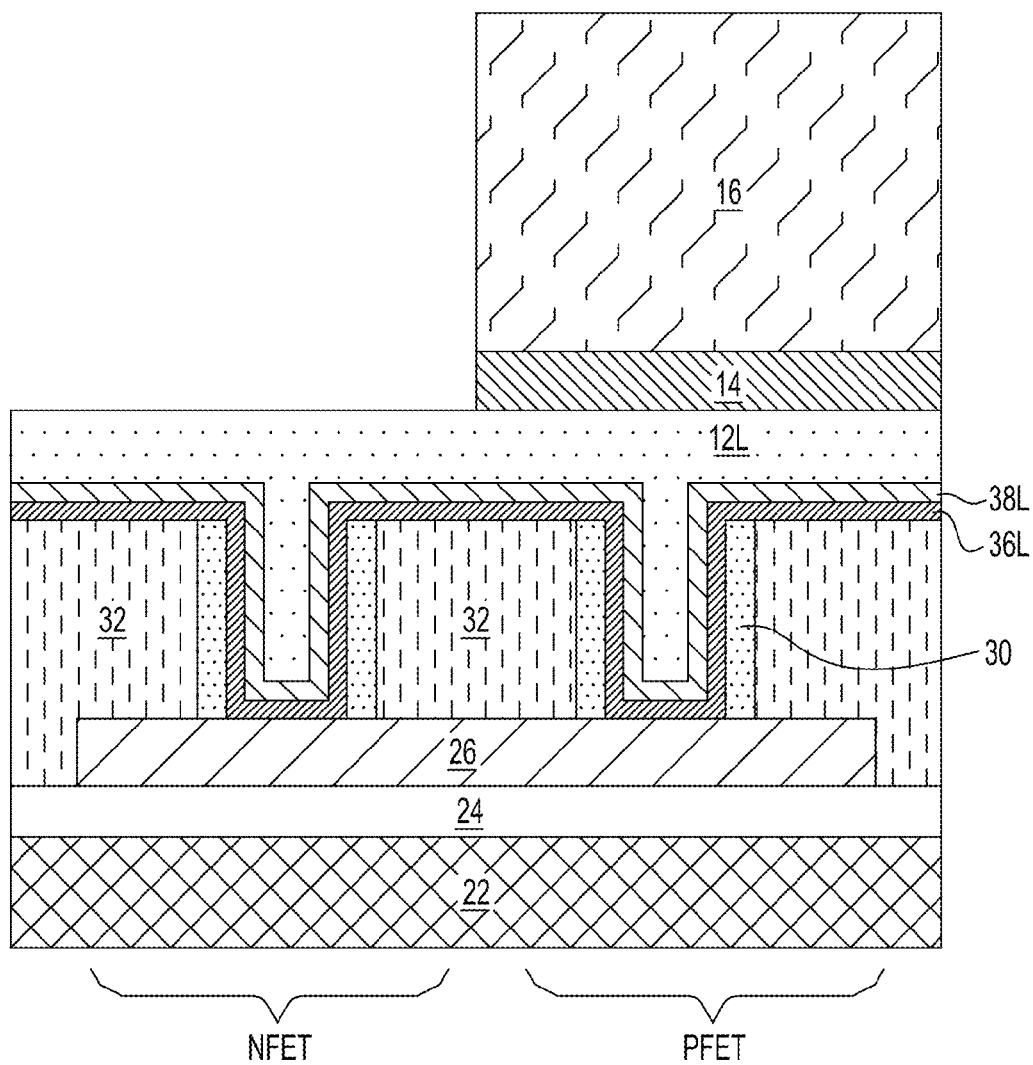
Figure 5C:
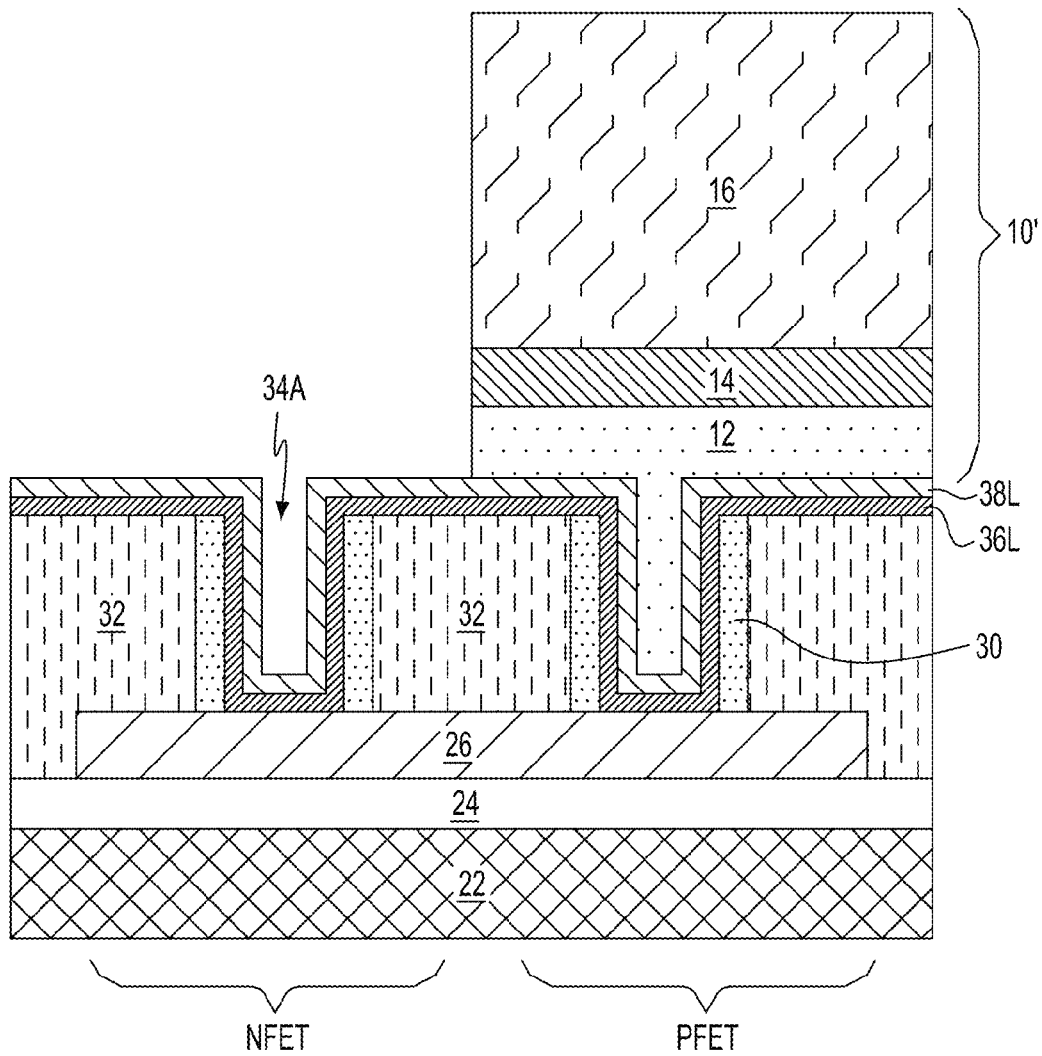

Referring to FIGS. 5A-5C, there are illustrated the exemplary semiconductor structure of FIG. 4 after patterning the trilayer stack 10 to expose a portion of the work function metal layer 38L in the NFET region.

The photoresist layer 16L is first patterned by lithographic exposure and development to provide a patterned photoresist layer 16 atop the TiARC layer 14L (see, for example, FIG. 5A). The pattern formed in the photoresist layer 16L is then transferred into the TiARC layer 14L (see, for example, FIG. 5B) and subsequently into the OPL 12L (see, for example, FIG. 5C) utilizing one or more etching processes using the work function metal layer 38L as an etch stop. The etch used to transfer the pattern may comprise a dry etching process, a wet chemical etching process or a combination thereof. Exemplary dry etching processes include, but are not limited to, RIE, ion beam etching, plasma etching and laser ablation. In one embodiment of the present disclosure, the TiARC layer 14L is etched by RIE and the OPL 12L is etched by RIE using a $N_2/H_2$ gas mixture. Remaining portion of the trilayer stack 10 is herein referred to as patterned trilayer stack 10'. In the patterned trilayer stack 10', a remaining portion of the photoresist layer 16L is herein referred to as patterned photoresist layer 16, a remaining portion of the TiARC layer 14L is herein referred to as patterned TiARC layer 14, and a remaining portion of the OPL 12L is herein referred to as patterned OPL 12.

Figure 6A:
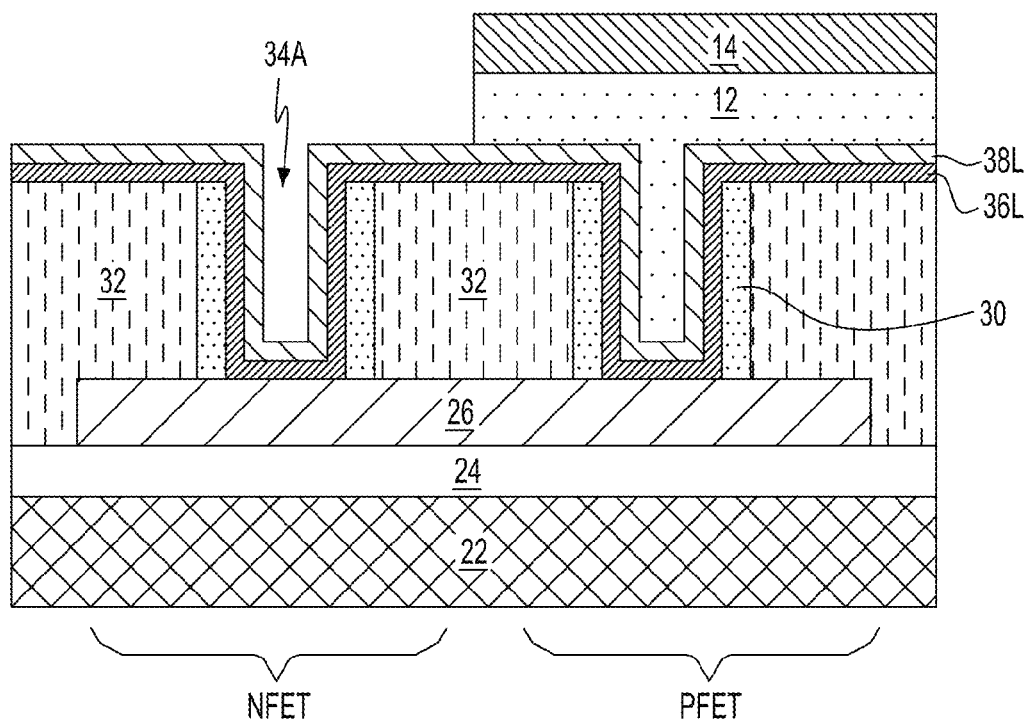
FIGS. 6A-6C are cross-sectional views of the exemplary semiconductor structure of FIGS. 5A-5C after sequentially removing layers in the patterned trilayer stack from a PFET region.
Figure 6B:
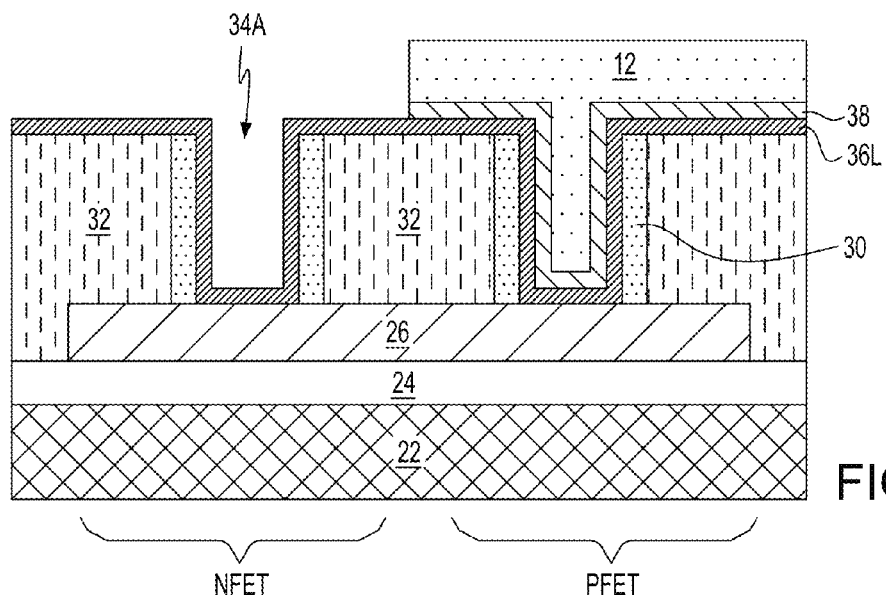
Figure 6C:
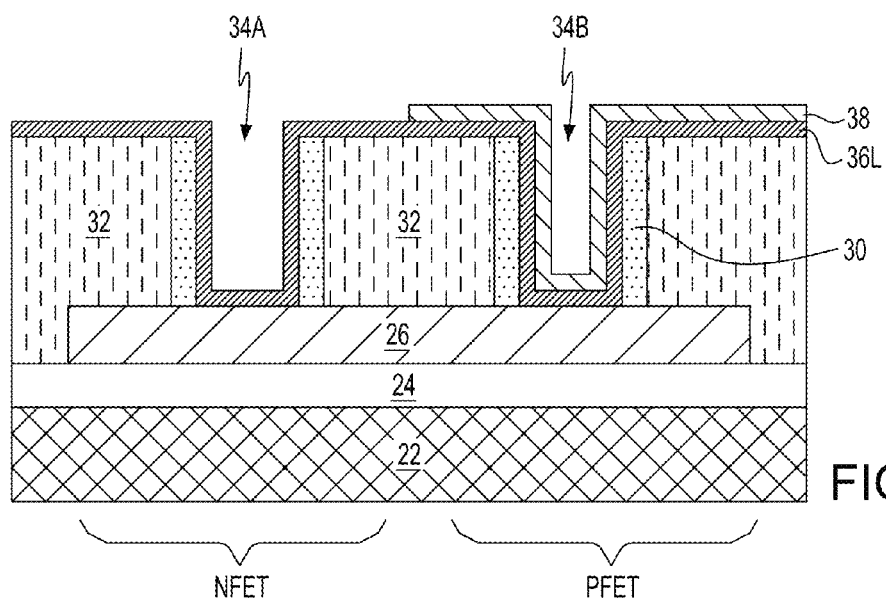

Referring to FIG. 6A-6C, there are illustrated the exemplary semiconductor structure of FIG. 5 after sequentially removing layers in the patterned trilayer stack 10' from the PFET region.

As shown in FIG. 6A, the patterned photoresist layer 16 can be first removed by a conventional stripping process, such as ashing. The patterned TiARC layer 14 can be removed by wet chemical etching selective to the patterned OPL portions 12 (FIG. 6B). In one embodiment, the patterned TiARC layer 14 is removed by using an alkaline solution (SC-1) including an aqueous mixture of ammonium hydroxide and hydrogen peroxide (e.g., 1:1:5 of 30% $H_2O_2$, 28% $NH_4OH$ and $H_2O$). In another embodiment, the patterned TiARC layer 14 is removed by applying a dilute hydrofluoric acid (HF) solution having a volume ratio of water to HF from 1000:1 to 100:1. In another embodiment, the patterned TiARC layer 14 is be removed by using an aqueous mixture of sulfuric acid and peroxide. In one embodiment and as shown in FIG. 6B, when the work function metal layer 38L is composed of TiN, during the above mentioned wet chemical etching of the patterned TiARC layer 14, the exposed portion of the work function metal layer 38L in the NFET region is also removed. The remaining portion of the work function metal layer 38L in the PFET region is herein referred to as the work functional metal layer portion 38.

The chemical enchant solution (e.g. SC1 and HF) used in the present disclosure for removing the patterned TiARC layer 14 causes no damages to the substrate and the gate dielectric layer 36L. After the exposed portion of the work function metal layer 38L in the NFET region is removed, the patterned OPL 12 can be removed by performing RIE ash using a $N_2/H_2$ gas mixture (FIG. 6C) selective to material of the underlying work function metal layer portion 38. Since the patterned OPL 12 can be etched faster in the $N_2/H_2$ gas mixture than the conventional OPL, the RIE process performed to remove the patterned OPL 12 causes no damages to the substrate, the exposed portion of the gate dielectric layer 36L in the NFET region and the work function metal layer portion 38 in the PFET region.

Figure 7:
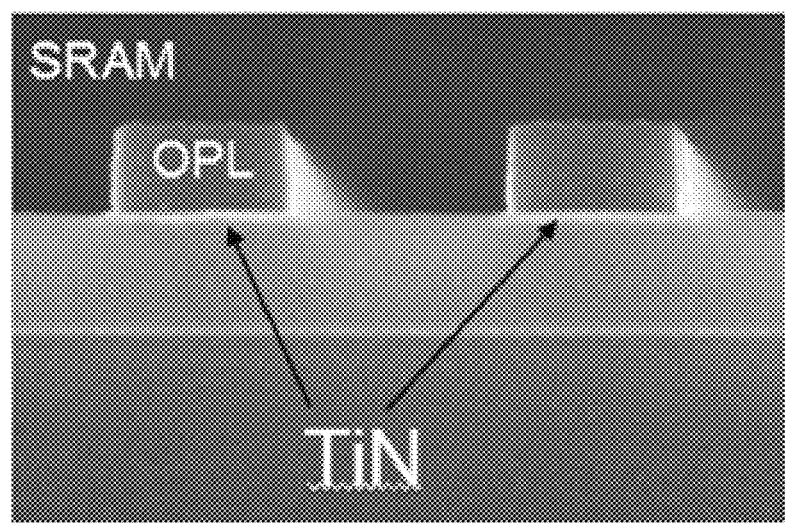
FIG. 7 is a SEM image of the semiconductor structure of FIG. 6B after the patterned TiARC layer and the exposed portion of the work function metal layer in the NFET region have been removed.

FIG. 7 is a SEM image of the semiconductor structure of FIG. 6B after the patterned TiARC layer 14 and the exposed portion of the work function metal layer 38L in the NFET region have been removed. In one embodiment and as shown in FIG. 7, when the work function metal layer 38L is composed of TiN, the portion of work function metal layer 38L that is not covered by the patterned OPL 12 (i.e., exposed portion) is completely removed during the removal of the patterned TiARC layer 14, while the remaining portion of the work function metal layer 38L located beneath the patterned OPL 12 is intact.

Figure 8:
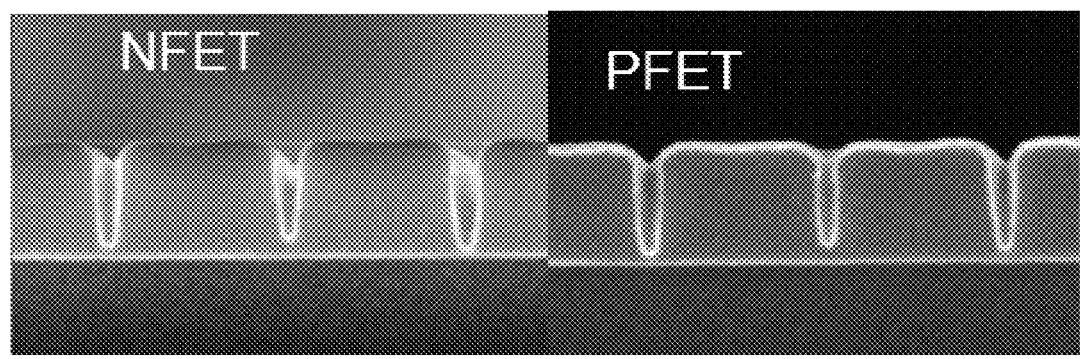
FIG. 8 is a SEM image of the cross-sectional view of the semiconductor structure of FIG. 6C showing the NFET region and the PFET region after the patterned trilayer stack has been removed from the PFET region.

FIG. 8 is a SEM image of the cross-sectional view of the semiconductor structure of FIG. 6C showing the NFET region and the PFET region after the patterned trilayer stack 10' has been removed from the PFET region. As shown in FIG. 8, the metal function metal layer 38L is no longer present in the NFET region and no residues from the trilayer stack 10 can be observed in gate cavities in both NFET region and PFET region.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure, comprising:
    forming a trilayer stack on an initial semiconductor structure formed on a substrate, the trilayer stack comprising an organic planarization layer (OPL), a titanium-containing antireflective coating (TiARC) layer on the OPL and a photoresist layer on the TiARC layer, wherein the TiARC layer comprises a Ti-containing organic inorganic hybrid polymer having a Ti-containing backbone with organic side chain functional groups;
    forming a pattern in the trilayer stack by etching through the trilayer stack to expose a portion of the initial semiconductor structure; and
    removing a remaining portion of the trilayer stack, wherein the removing the remaining portion of the trilayer stack causes no damage to a component of the semiconductor structure and the substrate, and wherein after the removing the remaining portion of the trilayer stack, substantially no residue from the trilayer stack remains in the semiconductor structure.

2. The method of claim 1, wherein the OPL comprises spin-on carbon, diamond-like carbon, polyarylene ether, or polyimide.

3. The method of claim 2, wherein the OPL has an etch rate ranging from 300 nm/min to 400 nm/min in a $N_2/H_2$ gas mixture.

4. The method of claim 1, further comprising transferring the pattern formed in the trilayer stack into the initial semiconductor structure.

5. The method of claim 1, wherein the organic side chain functional groups comprise liner or branched alkyl groups, liner or branched alkoxy groups, substituted or unsubstituted aryl groups, or combinations thereof.

6. The method of claim 1, wherein the TiARC layer has a thickness from 10 nm to 20 nm.

7. The method of claim 1, wherein the photoresist layer comprises methacrylates or polyesters.

8. The method of claim 1, wherein the forming the pattern in the initial semiconductor structure by etching through the trilayer stack comprises:
    forming a pattern in the photoresist layer;
    etching the TiARC layer to transfer the pattern into the TiARC layer; and
    etching the OPL layer to transfer the pattern into the OPL layer.

9. The method of claim 8, wherein the etching the TiARC layer and the etching the OPL layer are performed by a dry etch, a wet chemical etch or a combination thereof.

10. The method claim 9, wherein the dry etch comprises reactive ion etch, ion beam etching, plasma etching or laser ablation.

11. The method of claim 1, wherein the removing the remaining portion of the trilayer stack comprises:
    removing a remaining portion of the photoresist layer;
    removing a remaining portion of the TiARC layer; and
    removing a remaining portion of the OPL.

12. The method of claim 11, wherein the remaining portion of the TiARC layer is removed by a wet chemical etch using an etchant solution.

13. The method of claim 12, wherein the etchant solution is an alkaline solution comprising ammonium hydroxide and hydrogen peroxide.

14. The method of claim 12, wherein the etchant solution is an aqueous solution of sulfuric acid and hydrogen peroxide.

15. The method of claim 11, wherein the remaining portion of the OPL is removed by reactive ion etch using a $N_2/H_2$ gas mixture.

16. The method of claim 1, further comprising forming the initial semiconductor structure, wherein the forming the initial semiconductor structure comprises:
    forming a plurality of sacrificial gate structures over a portion of each of semiconductor fins provided on the substrate, wherein the sacrificial gate structures are laterally bound by interlayer dielectric (ILD) layer portions;
    removing the sacrificial gate structures to provide gate cavities;
    forming a gate dielectric layer over surfaces of the gate cavities and top surfaces of the ILD layer portions; and
    forming a work function metal layer over the gate dielectric layer.

17. The method of claim 16, wherein the work functional metal layer comprises TiN.

18. The method of claim 17, wherein the removing of the remaining TiARC layer removes a portion of the work function metal layer exposed by the patterned trilayer stack simultaneously.

19. A method of forming a semiconductor structure, comprising:
    forming an initial semiconductor structure on a substrate, wherein the forming the initial semiconductor structure comprises:
        forming a plurality of sacrificial gate structures over a portion of each of semiconductor fins provided on the substrate, wherein the sacrificial gate structures are laterally bound by interlayer dielectric (ILD) layer portions,
        removing the sacrificial gate structures to provide gate cavities,
        forming a gate dielectric layer over surfaces of the gate cavities and top surfaces of the ILD layer portions, and
        forming a work function metal layer over the gate dielectric layer, wherein the work functional metal layer comprises TiN;
    forming a trilayer stack on the initial semiconductor structure, the trilayer stack comprising an organic planarization layer (OPL), a titanium-containing antireflective coating (TiARC) layer on the OPL and a photoresist layer on the TiARC layer;

forming a pattern in the trilayer stack by etching through the trilayer stack to expose a portion of the initial semiconductor structure; and removing a remaining portion of the trilayer stack, wherein the removing the remaining portion of the trilayer stack causes no damage to a component of the semiconductor structure and the substrate, and wherein after the removing the remaining portion of the trilayer stack, substantially no residue from the trilayer stack remains in the semiconductor structure, and wherein the removing of the remaining TiARC layer removes a portion of the work function metal layer exposed by the patterned trilayer stack simultaneously.

* * * * *